United States Patent [19]
Cheng et al.

[11] Patent Number: 6,020,273
[45] Date of Patent: Feb. 1, 2000

[54] METHOD OF STABILIZING LOW DIELECTRIC CONSTANT FILMS

[75] Inventors: Yao-Yi Cheng, Taipei; Syun-Min Jang; Chen-Hua Yu, both of Hsin-Chu, all of Taiwan

[73] Assignee: Taiwan Semiconductor Manufacturing Company, Hsin-Chu, Taiwan

[21] Appl. No.: 09/005,569

[22] Filed: Jan. 12, 1998

[51] Int. Cl.$^7$ .................................................. H01L 21/00
[52] U.S. Cl. ........................................ 438/782; 438/723
[58] Field of Search ...................................... 438/782, 723

[56] References Cited

U.S. PATENT DOCUMENTS

| | | | |
|---|---|---|---|
| 5,270,267 | 12/1993 | Ovellet | 437/231 |
| 5,393,702 | 2/1995 | Yang et al. | 437/195 |
| 5,549,786 | 8/1996 | Jones et al. | 156/662.1 |
| 5,567,658 | 10/1996 | Wang et al. | 437/228 |
| 5,643,407 | 7/1997 | Chang | 156/644.1 |

Primary Examiner—Charles Bowers
Assistant Examiner—Lisa Kilday
Attorney, Agent, or Firm—George O. Saile; Stephen B. Ackerman; Larry J. Prescott

[57] ABSTRACT

A method of forming dielectric films is described wherein the low dielectric constant of a layer of dielectric material having a low dielectric constant, such as low dielectric constant spin-on-glass, is stabilized to prevent subsequent processing steps from increasing the dielectric constant. The layer of dielectric material having a low dielectric constant is treated in an inert atmosphere, such as nitrogen or argon, at an elevated temperature. This inert atmosphere treatment of the dielectric prevents the dielectric constant from increasing during subsequent processing steps.

20 Claims, 1 Drawing Sheet

METHOD OF STABILIZING LOW DIELECTRIC CONSTANT FILMS

BACKGROUND OF THE INVENTION (1) Field of the Invention

This invention relates to the treatment of an intermetal dielectric layer to stabilize the dielectric constant of the intermetal dielectric. More specifically the invention relates to the treating of an intermetal dielectric layer in an inert atmosphere at elevated temperature.

(2) Description of the Related Art

In integrated circuit wafers is common to have a structure of a patterned layer of conductor material, a first silicon oxide layer deposited on the conductor material, an intermetal dielectric layer deposited on the first silicon oxide layer, and a second silicon oxide layer deposited on the intermetal dielectric layer. A patterned layer of second conductor material is then formed on the second silicon oxide layer. One of the problems of this structure is that the steps of depositing the second silicon oxide layer and alloying the second conductor material degrades, or increases, the dielectric constant of the intermetal dielectric layer. This increase in dielectric constant results in increase of stray capacitance which is very undesirable. This invention describes an inert atmosphere treatment of the intermetal dielectric layer in order to prevent this degradation of dielectric constant from occurring.

U.S. Pat. No. 5,643,407 to Chang describes a nitrogen plasma treatment of the exposed edge of a spin-on-glass layer after etching a via hole to prevent via hole etching.

U.S. Pat. No. 5,270,267 to Ouellet describes a method of precuring a film of spin-on-glass to remove the bulk of the solvents followed by curing of the film in a plasma reactor to remove the bulk of the SiOH, organic volitles, and $H_2O$ form the film.

U.S. Pat. No. 5,567,658 to Wang et al. describes a method of removing polymeric deposits from the surface of a spin-on-glass layer to prevent peeling of subsequently formed layers of material. The method describes exposing the surface of an etched back spin-on-glass layer to a gas discharge plasma of nitrous oxide or nitrogen.

U.S. Pat. No. 5,393,702 to Yang et al. describes a structure which includes an intermetal dielectric layer of spin-on-glass. A via hole is etched in the intermetal dielectric layer. A silicon nitride cap is then formed on the exposed edges of the spin-on-glass intermetal dielectric layer to prevent outgassing of the spin-on-glass and subsequent via poisoning.

SUMMARY OF THE INVENTION

It is usually desirable to keep the dielectric constant of a dielectric layer, such as an intermetal dielectric between two layers of conducting electrodes, as low as possible. Keeping the dielectric constant of such intermetal dielectric layers as low as possible is important in keeping stray capacitance between electrodes as low as possible.

It is an objective of this invention to provide a method of treating a dielectric layer having a low dielectric constant whereby the low dielectric constant will be stabilized and not be degraded, or increased, by subsequent processing steps.

This objective is achieved by treating the dielectric layer having a low dielectric constant, in this example low dielectric constant spin-on-gas, by heating the dielectric layer in an inert atmosphere, such as nitrogen or argon. This high temperature treatment stabilizes the low dielectric constant dielectric so that the following high temperature processing steps, such as the deposition of a cap oxide layer on the low dielectric constant dielectric layer or the alloying of subsequent metal depositions does not degrade the low dielectric constant.

DESCRIPTION OF THE PREFERRED EMBODIMENTS

Figure 1:
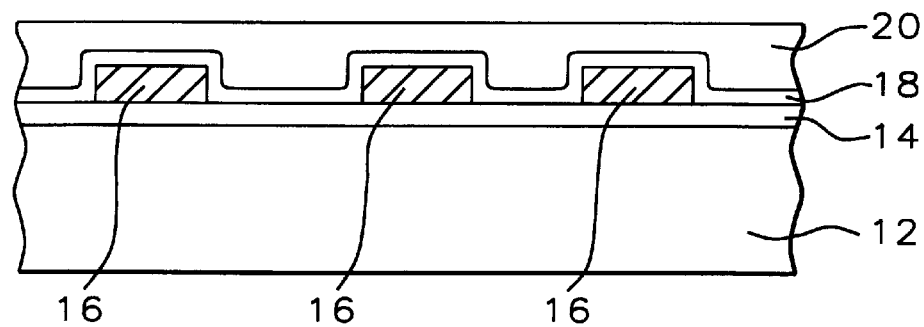
FIG. 1 shows a cross section view of a portion of an integrated circuit wafer having a fourth dielectric layer, a patterned layer of first conductor material, a first dielectric layer, and a second dielectric layer.

The preferred embodiments will now be described with reference to FIGS. 1–3. FIG. 1 shows a cross section view of part of a substrate 12, such as a silicon integrated circuit wafer, with a fourth dielectric layer 14 formed thereon and devices, not shown, formed therein. A patterned layer of first conductor material 16, such as polysilicon, aluminum, aluminum-copper, aluminum-copper-silicon, or the like, is formed on the layer of fourth dielectric material. In this example the fourth dielectric layer is silicon dioxide. A layer of first dielectric material 18, such as silicon oxide, is then deposited on the wafer 12. In this example the first dielectric material 18 is silicon dioxide having a thickness less than or equal to about 1000 Angstroms and deposited using a method such as chemical vapor deposition using tetra-ethyl-ortho-silicate. Next, a layer of second dielectric material 20 having a dielectric constant between about 1.0 and 3.0 is deposited on the layer of first dielectric material 18. In this example the layer of second dielectric material 20 is low dielectric constant spin-on-glass having a thickness of between about 2000 and 10,000 Angstroms and a dielectric constant of between about 1.0 and 3.0.

The next step is the critical step of the invention wherein the layer of low dielectric constant spin-on-glass 20 is treated in an inert atmosphere to protect the low dielectric properties from subsequent processing steps. As shown in FIG. 3, the wafer with the deposited layer of second dielectric in place 10 is placed in a chamber having an inert atmosphere 28 and controlled temperature. In the first embodiment of this invention the wafer 10 is placed in a chamber 26 having a nitrogen atmosphere 28 at a temperature of between about 350° C. and 450° C. for between about 30 and 90 seconds. The nitrogen atmosphere in the chamber is maintained by flowing nitrogen gas through the chamber at a flow rate of between about 800 and 1200 standard cubic centimeters per minute. This nitrogen treatment protects the spin-on-glass dielectric constant from degradation during subsequent processing steps, especially processing steps involving elevated temperatures and oxides.

Figure 2:
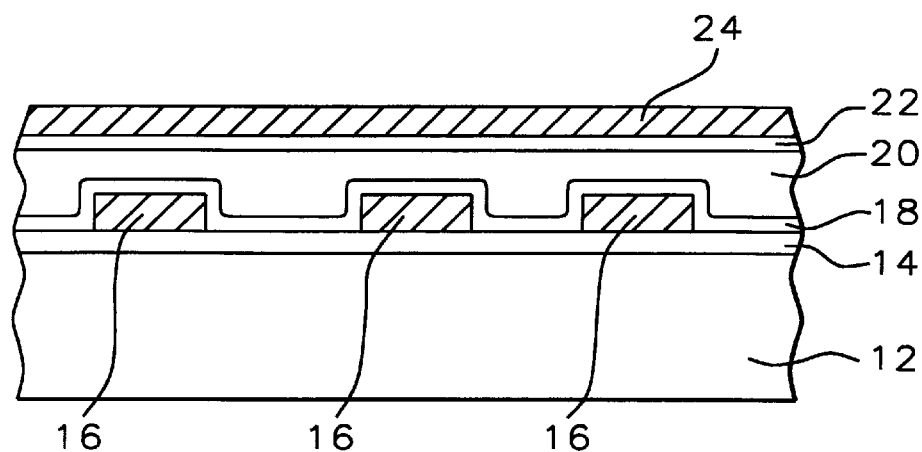
FIG. 2 shows a cross section view of a portion of an integrate circuit wafer having a fourth dielectric layer, a patterned layer of first conductor material, a first dielectric layer, a second dielectric layer, a third dielectric layer, and a patterned layer of second conductor material.
Figure 3:
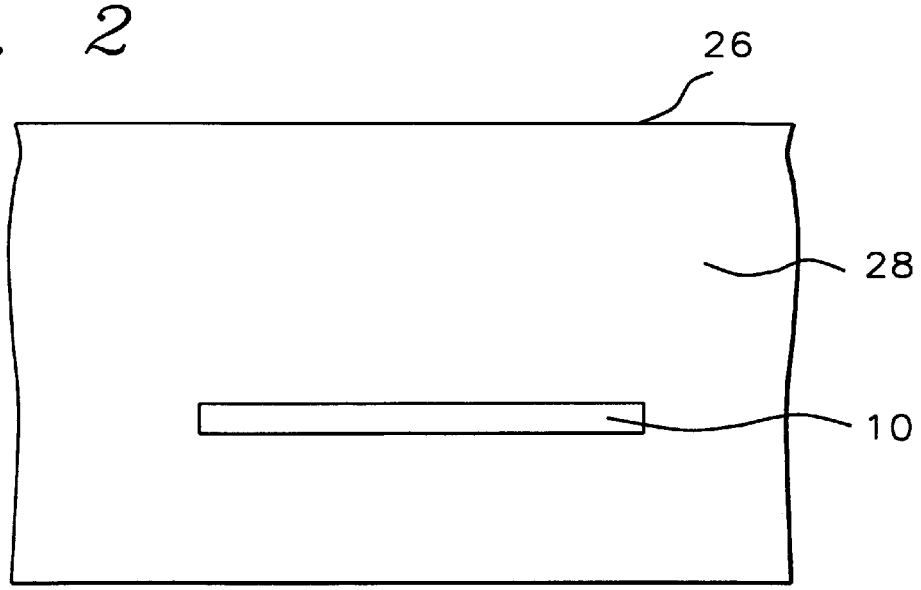
FIG. 3 shows a diagrammatic view of a chamber used to subject the integrated circuit wafer to an inert atmosphere treatment.

Next, as shown in FIG. 2, a layer of third dielectric material 22 is formed on the layer of second dielectric 18. In this example the layer of third dielectric is a cap oxide layer of silicon dioxide deposited using plasma enhanced chemical vapor deposition from tetraethyl-ortho-silicate at a temperature of between about 350° C. and 450° C. and having a thickness of between about 3000 and 6000 Angstroms. Next, as shown in FIG. 2, a layer of second conductor material 24, such as aluminum-copper or the like, is deposited on the layer of third dielectric material 22, alloyed at a temperature of between about 400° C. and 500° C. and patterned. Without the nitrogen treatment of the layer of spin-on-glass 20, at the elevated temperatures used in the deposition of the layer of third dielectric material and/or the alloying of the layer of second conductor material 24 the oxygen from the layer of third dielectric material 22 would interact with the layer of spin-on-glass and increase the dielectric constant thereby increasing the stray capacitance between electrodes. The nitrogen treatment of the layer of second dielectric material stabilizes the dielectric constant and prevents the increase in the dielectric constant from occurring.

Stray capacitance between electrodes has been measured for a particular electrode configuration for a device fabricated using the nitrogen treatment of this invention and without the nitrogen treatment of this invention. The capacitance without the nitrogen treatment was 10.83 pF and the capacitance with the nitrogen treatment of this invention was 9.69 pF. In this configuration the nitrogen treatment of this invention reduced the stray capacitance by about 10%.

In another embodiment of this invention an argon atmosphere is used in place of a nitrogen atmosphere. As shown in FIG. 1, the fourth dielectric layer 14, patterned layer of first conductor material 16, layer of first dielectric material 18, and layer of second dielectric material 28 having a low dielectric constant are formed on the wafer 12 as described in the preceding embodiment. In this example the fourth dielectric is silicon dioxide, the first dielectric is silicon dioxide, and the layer of second dielectric material is spin-on-glass having a dielectric constant of between about 1.0 and 3.0 and a thickness of between about 2000 and 10,000 Angstroms. In this example the first conductor material is aluminum, aluminum-copper, aluminum-copper-silicon, polysilicon or the like.

As in the preceding embodiment, the next step is the critical step of the invention wherein the layer of low dielectric constant spin-on-glass 20 is treated in an inert atmosphere to protect the low dielectric properties from subsequent processing steps. As shown in FIG. 3, the wafer with the deposited layer of second dielectric in place 10 is placed in a chamber 26 having an argon atmosphere 28 at a temperature of between about 350° C. and 450° C. for between about 30 and 90 seconds. The argon atmosphere in the chamber is maintained by flowing argon gas through the chamber at a flow rate of between about 800 and 1200 standard cubic centimeters per minute. This argon treatment protects the spin-on-glass dielectric constant from degradation during subsequent processing steps, especially processing steps involving elevated temperatures and oxides.

Next, as shown in FIG. 2, a layer of third dielectric material 22 is formed on the layer of second dielectric 18. In this example the layer of third dielectric is a cap oxide layer of silicon dioxide deposited using plasma enhanced chemical vapor deposition from tetra-ethyl-ortho-silicate at a temperature of between about 350° C. and 450° C. and having a thickness of between about 3000 and 6000 Angstroms. Next, as shown in FIG. 2, a layer of second conductor material 24, such as aluminum-copper or the like, is deposited on the layer of third dielectric material 22, alloyed at a temperature of between about 400° C. and 500° C. and patterned. Without the argon treatment of the layer of spin-on-glass 20, at the elevated temperatures used in the deposition of the layer of third dielectric material and/or the alloying of the layer of second conductor material 24 the oxygen from the layer of third dielectric material 22 would interact with the layer of spin-on-glass and increase the dielectric constant thereby increasing the stray capacitance between electrodes. The argon treatment of the layer of second dielectric material stabilizes the dielectric constant and prevents the increase in the dielectric constant from occurring.

While the invention has been particularly shown and described with reference to the preferred embodiments thereof, it will be understood by those skilled in the art that various changes in form and details may be made without departing from the spirit and scope of the invention.

What is claimed is:

1. A method of forming dielectric films, comprising the steps of:

providing a substrate;

forming a patterned layer of first conductor material on said substrate;

forming a layer of first dielectric material on said patterned layer of first conductor material;

forming a layer of second dielectric material on said substrate covering said layer of first dielectric material wherein said layer of second dielectric material has a dielectric constant of between about 1.0 and 3.0.;

exposing said layer of second dielectric material to a nitrogen treatment by placing said substrate in a chamber having a nitrogen atmosphere at a temperature of between about 350° C. and 450° C. for between about 30 and 90 seconds;

forming a layer of third dielectric on said layer of second dielectric after exposing said layer of second dielectric to said nitrogen treatment; and forming a patterned layer of second conductor material on said layer of third dielectric.

2. The method of claim 1 wherein said nitrogen atmosphere is maintained by flowing nitrogen gas through said chamber at a flow rate of between about 800 and 1200 standard cubic centimeters per minute.

3. The method of claim 1 wherein said layer of first dielectric is a layer of silicon dioxide having a thickness equal to or less than about 1000 Angstroms.

4. The method of claim 1 wherein said layer of second dielectric material is a layer of spin-on-glass having a thickness of between about 2000 and 10,000 Angstroms.

5. The method of claim 1 wherein said layer of third dielectric is a layer of silicon dioxide having a thickness of between about 3000 and 6000 Angstroms.

6. The method of claim 5 wherein said layer of third dielectric is deposited using plasma enhanced chemical vapor deposition from tetra-ethyl-ortho-silicate.

7. The method of claim 1 wherein said layer of third dielectric is deposited at a temperature of between about 350° C. and 450° C.

8. The method of claim 1 wherein said substrate is a silicon integrated circuit wafer having devices formed therein.

9. The method of claim 1 further comprising forming a layer of fourth dielectric material on said substrate before forming said patterned layer of first conductor material, wherein said patterned layer of first conductor material is formed on said layer of fourth dielectric.

10. The method of claim 9 wherein said layer of fourth dielectric material is silicon dioxide.

11. A method of forming dielectric films, comprising the steps of:

providing a substrate;

forming a patterned layer of first conductor material on said substrate;

forming a layer of first dielectric material on said patterned layer of first conductor material;

forming a layer of second dielectric material on said substrate covering said layer of first dielectric material wherein said layer of second dielectric material has a dielectric constant of between about 1.0 and 3.0.;

exposing said layer of second dielectric material to an argon treatment by placing said substrate in a chamber having an argon atmosphere at a temperature of between about 350° C. and 450° C. for between about 30 and 90 seconds;

forming a layer of third dielectric on said layer of second dielectric after exposing said layer of second dielectric to said argon treatment; and forming a patterned layer of second conductor material on said layer of third dielectric.

12. The method of claim 11 wherein said argon atmosphere is maintained by flowing argon gas through said chamber at a flow rate of between about 800 and 1200 standard cubic centimeters per minute.

13. The method of claim 11 wherein said layer of first dielectric is a layer of silicon dioxide having a thickness of equal to or less than about 1000 Angstroms.

14. The method of claim 11 wherein said layer of second dielectric material is a layer of spin-on-glass having a thickness of between about 2000 and 10,000 Angstroms.

15. The method of claim 11 wherein said layer of third dielectric is a layer of silicon dioxide having a thickness of between about 3000 and 6000 Angstroms.

16. The method of claim 15 wherein said layer of third dielectric is deposited using plasma enhanced chemical vapor deposition from tetra-ethyl-ortho-silicate.

17. The method of claim 11 wherein said layer of third dielectric is deposited at a temperature of between about 350° C. and 450° C.

18. The method of claim 11 wherein said substrate is a silicon integrated circuit wafer having devices formed therein.

19. The method of claim 11 further comprising forming a layer of fourth dielectric material on said substrate before forming said patterned layer of first conductor material, wherein said patterned layer of first conductor material is formed on said layer of fourth dielectric.

20. The method of claim 19 wherein said layer of fourth dielectric material is silicon dioxide.

* * * * *